(12) United States Patent
Matsui

(10) Patent No.: US 8,390,338 B2
(45) Date of Patent: Mar. 5, 2013

(54) SEMICONDUCTOR DEVICE HAVING SIGNAL TRANSFER LINE

(75) Inventor: Yoshinori Matsui, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 132 days.

(21) Appl. No.: 12/909,327

(22) Filed: Oct. 21, 2010

(65) Prior Publication Data

US 2011/0095809 A1   Apr. 28, 2011

(30) Foreign Application Priority Data

Oct. 23, 2009   (JP) ................................ 2009-244935

(51) Int. Cl.
*H03B 1/00* (2006.01)
*H03K 3/00* (2006.01)

(52) U.S. Cl. ........ 327/108; 327/109; 327/110; 327/111; 327/112; 327/333; 326/63; 326/74; 326/80; 326/81

(58) Field of Classification Search .......... 327/108–112, 327/33; 326/63–74, 80, 81
See application file for complete search history.

(56) References Cited

U.S. PATENT DOCUMENTS

| | | | |
|---|---|---|---|
| 5,646,809 A * | 7/1997 | Motley et al. | 361/56 |
| 7,236,021 B2 * | 6/2007 | Childers et al. | 327/108 |
| 7,592,853 B2 * | 9/2009 | Nakamori et al. | 327/434 |
| 2008/0094111 A1 * | 4/2008 | Nakamori et al. | 327/108 |
| 2010/0308888 A1 * | 12/2010 | Kubo | 327/333 |
| 2011/0273129 A1 * | 11/2011 | Coe et al. | 320/101 |
| 2012/0050931 A1 * | 3/2012 | Terry et al. | 361/91.5 |
| 2012/0127816 A1 * | 5/2012 | Kajigaya et al. | 365/205 |
| 2012/0249228 A1 * | 10/2012 | Hong | 327/544 |

FOREIGN PATENT DOCUMENTS

JP   2007-273980 A   10/2007

* cited by examiner

*Primary Examiner* — Adam Houston
(74) *Attorney, Agent, or Firm* — Sughrue Mion, PLLC

(57) ABSTRACT

To include a switch transistor inserted between a data bus and an input end of a signal receiving circuit and turned off when a potential of the data bus reaches VPERI–NVth, and an assist transistor that drives the input end of the signal receiving circuit to have VPERI. According to the present invention, because the switch transistor and the assist transistor assist a receiving operation performed by the signal receiving circuit, amplitude of a transferred signal can be reduced without reducing a transfer rate. With this configuration, power consumed by charging or discharging of the data bus can be reduced.

31 Claims, 11 Drawing Sheets

SEMICONDUCTOR DEVICE HAVING SIGNAL TRANSFER LINE

BACKGROUND OF THE INVENTION

1. Field of the Invention

The present invention relates to a semiconductor device, and more particularly relates to a semiconductor device including a signal transfer line and a signal receiving circuit.

2. Description of Related Art

A signal transfer line is used to transfer signals in a semiconductor device and to transfer signals among plural semiconductor devices. There have been known a single-end method using a single signal and a differential method using complementary signals as methods of transferring signals in semiconductor devices (see Japanese Patent Application Laid-open No. 2007-273980).

However, a signal transfer line is charged or discharged when a logical level of a signal to be transferred is inverted no matter what method is used, and it results in consumption of power. Therefore, when the number of signal transfer lines is large, a charging/discharging current increases accordingly. Accordingly, it is desired to suppress the power consumed by charging or discharging of the signal transfer line as much as possible for purposes intended at low power consumption.

SUMMARY

In one embodiment, there is provided a semiconductor device having a signal transfer line and a signal receiving circuit that includes: a switch circuit inserted between the signal transfer line and an input end of the signal receiving circuit, a state of the switch circuit changing from a conductive state to a cutoff state when a potential of the signal transfer line changes from a first potential to a third potential, which is in between the first potential and a second potential; and a voltage supply circuit that is connected to the input end of the signal receiving circuit, and drives the input end of the signal receiving circuit to have the second potential after at least the switch circuit turns into a cutoff state.

According to the present invention, the switch circuit and the voltage supply circuit assist a receiving operation performed by the signal receiving circuit, and this can reduce amplitude of a signal to be transferred without reducing a transfer rate. This can realize reduction in power consumed by charging or discharging of the signal transfer line.

BRIEF DESCRIPTION OF THE DRAWINGS

The above features and advantages of the present invention will be more apparent from the following description of certain preferred embodiments taken in conjunction with the accompanying drawings, in which.

DETAILED DESCRIPTION OF THE EMBODIMENTS

Preferred embodiments of the present invention will be explained below in detail with reference to the accompanying drawings.

Figure 1:
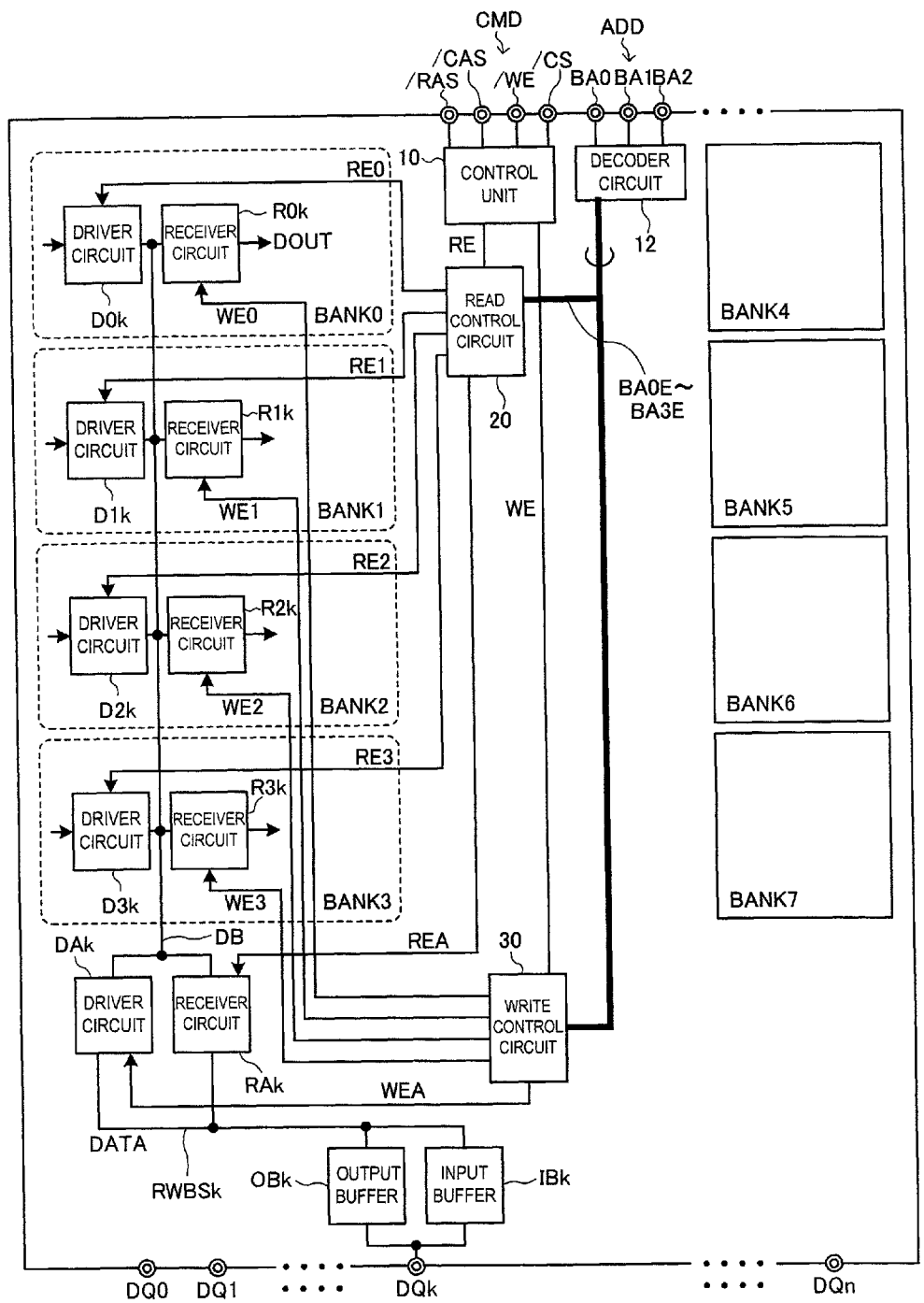
FIG. 1 is a block diagram showing a configuration of a semiconductor device according to an embodiment of the present invention.

FIG. 1 is a block diagram showing a configuration of a semiconductor device according to an embodiment of the present invention. This embodiment is an example of applying the present invention to a DDR (Double Data Rate) 2 DRAM (Dynamic Random Access Memory).

As shown in FIG. 1, the semiconductor device according to the present embodiment includes eight memory banks BANK0 to BANK7 and data input/output terminals DQ0 to DQn from which read data read from these memory banks BANK0 to BANK7 is output or to which write data to be written to the memory banks BANK0 to BANK7 is input. The number (n+1) of data input/output terminals DQ0 to DQn is not limited to any specific number, and can be set to 32 (n=31), for example. These (n+1) data input/output terminals DQ0 to DQn are shared among the eight memory banks BANK0 to BANK7. Accordingly, read data or write data of (n+1) bits input or output via the data input/output terminals DQ0 to DQn is allocated to some of the memory banks BANK0 to BANK7. The "memory banks" are units that can accept commands independently of one another and that can operate independently of one another.

Commands are input to the semiconductor device from outside via a command input terminal CMD. External commands including a row address enable signal/RAS, a column address strobe signal/CAS, a write enable signal/WE, and a chip select signal/CS are input to the command input terminal CMD. These external commands are supplied to a control unit 10, and an internal read enable signal RE, an internal write enable signal WE and the like are generated according to a combination of the logical levels of the external commands. The internal read enable signal is a signal activated when one external command indicates a read operation and supplied to a read control circuit 20. The internal enable signal WE is a signal activated when one external command indicates a write operation and supplied to a write control circuit 30.

The read control circuit 20 activates a read control signal REA and activates any one of read control signals RE0 to RE3 when the internal read enable signal RE is input to the read control circuit 20. Similarly, the write control circuit 30 activates a write control signal WEA and activates any one of write control signals WE0 to WE3 when the internal write enable signal WE is input to the write control circuit 30.

Each of bank addresses BA0 to BA2 input from an address input terminal ADD designates which of the read control signals RE0 to RE3 or the write control signals WE0 to WE3 is to be activated. The bank addresses BA0 to BA2 are input to a decoder circuit 12 and the decoder circuit 12 generates bank selection signals BA0E to BA3E. The bank selection signals BA0E to BA3E are supplied to the read control circuit 20 and the write control circuit 30. As a result, during a read operation, any one of the read control signals RE0 to RE3 is activated, and during a write operation, any one of the write control signals WE0 to WE3 is activated. The bank addresses BA0 to BA2 are addresses for selecting any one of the memory banks BANK0 to BANK7 and input from outside in cooperation with the external command.

Figure 2:
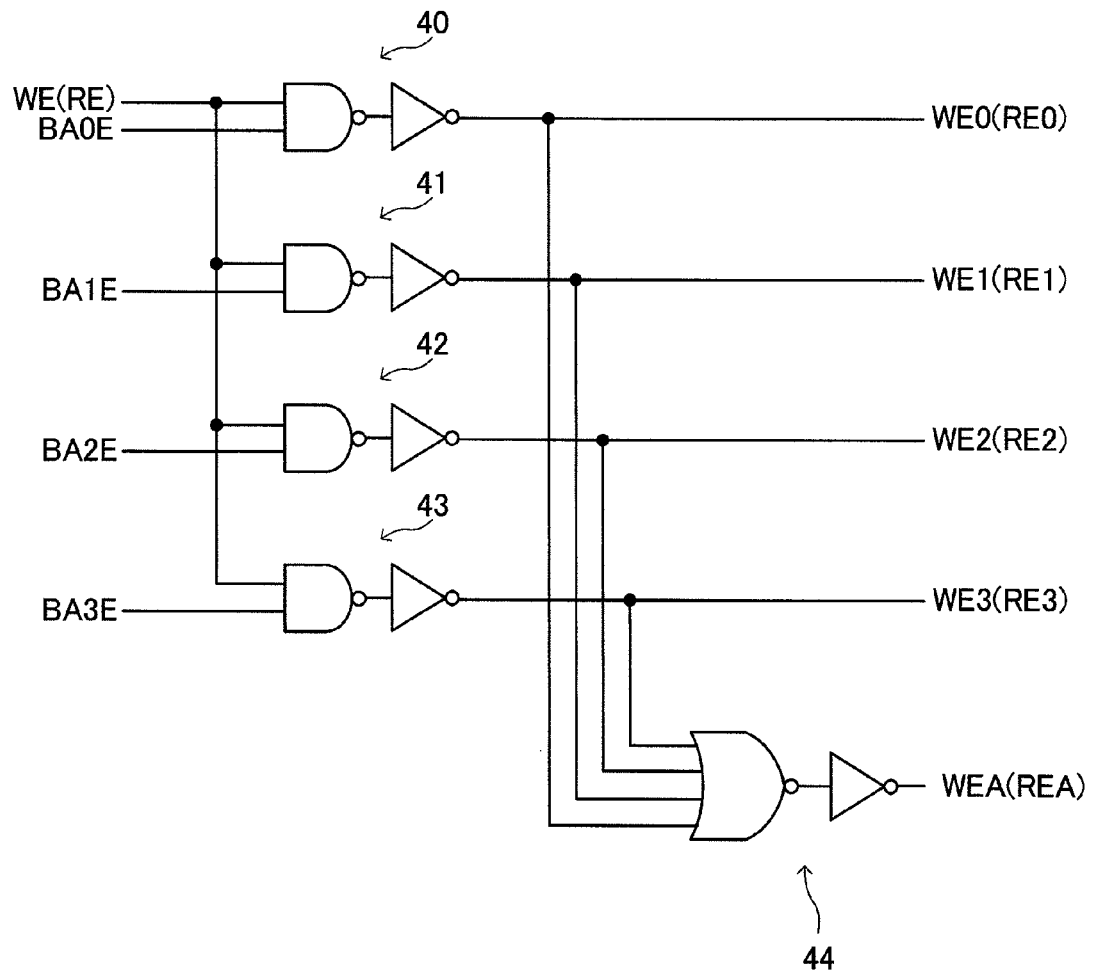
FIG. 2 is a circuit diagram of the write control circuit 30.

FIG. 2 is a circuit diagram of the write control circuit 30.

As shown in FIG. 2, the write control circuit 30 includes AND circuits 40 to 43 to one input end of each of which one of the bank selection signals BA0E to BA3E is supplied and to the other input end thereof the write enable signal WE is supplied, and an OR circuit 44 calculating a logical OR among outputs from these AND circuits 40 to 43. The outputs from the AND circuits 40 to 43 are used as the write control signals WE0 to WE3, respectively. Accordingly, when the write enable signal WE is activated, any one of the write control signals WE0 to WE3 is activated based on any corresponding one of the bank selection signals BA0E to BA3E. Further, the write control signal WEA is activated when the internal write enable signal WE is activated and one of the bank selection signals BA0E to BA3E is activated. Because the circuit configuration of the read control circuit 20 is also identical to that of the write control circuit 30, redundant explanations thereof will be omitted.

The read control circuit 20 and the write control circuit 30 described above are the circuits operating when the memory banks BANK0 to BANK3 are selected. Although not shown, when the memory banks BANK4 to BANK7 are selected, a read control circuit and a write control circuit other than the read control circuit 20 and the write control circuit 30 operate. Accordingly, corresponding one of read control signals or write control signals is activated.

Referring back to FIG. 1, an input buffer IB and an output buffer OB are provided on each of the data input/output terminals DQ0 to DQn. FIG. 1 only shows an input buffer IBk and an output buffer OBk provided on a data input/output terminal DQk for brevity. As described above, the semiconductor device according to the present embodiment is a DDR2 DRAM, and therefore performs a four-bit pre-fetch operation. That is, four bits of write data input to the data input/output terminal DQk in series are written via four read/write busses RWBSk in parallel, respectively. Conversely, four bits of read data read via the four read/write busses RWBSk in parallel, respectively are output from the data input/output terminal DQk in series. In this way, the semiconductor device according to the present embodiment needs at least 128 (=32×4) read/write busses RWBS, because four read/write busses RWBS are provided per data input/output terminal DQ. Furthermore, in the present embodiment, a bank area is divided into an area (a left area in FIG. 1) where the memory banks BANK0 to BANK3 are formed and an area (a right area in FIG. 1) where the memory banks BANK4 to BANK7 are formed. The read/write busses RWBS are allocated to each of the left and right areas. In all, 256 read/write busses RWBS are provided in the semiconductor device according to the present embodiment. However, for brevity, FIG. 1 only shows read/write busses RWBSk allocated to the memory banks BANK0 to BANK3 and the data input/output terminal DQk.

As shown in FIG. 1, each of the read/write busses RWBSk is connected to a driver circuit DAk and a receiver circuit RAk. The driver circuit DAk is a circuit activated by the write control signal WEA whereas the receiver circuit RAk is a circuit activated by the read control signal REA. An input end of the driver circuit DAk and an input end of the receiver RAk are connected to a data bus DB (a signal transfer line).

Figure 3:
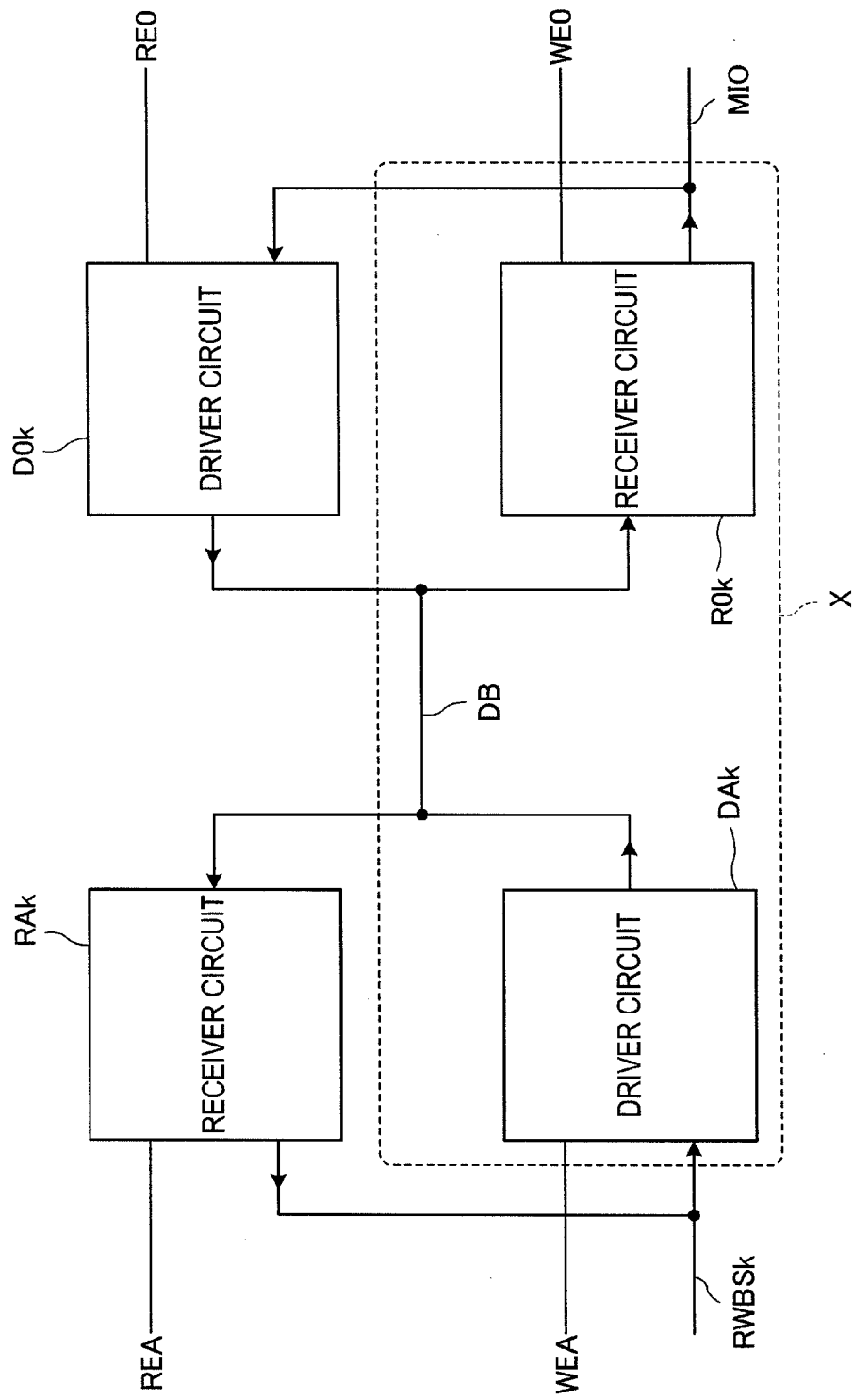
FIG. 3 is a block diagram showing a connection relation among the driver circuit DAk, the receiver circuit RAk, the driver circuit D0k, and the receiver circuit R0k.

The data bus DB is a wiring connecting the driver circuit DAk and receiver circuit RAk to driver circuits D0k to D3k and receiver circuits R0k to R3k provided in the memory banks BANK0 to BANK3, respectively. Four data buses DB are provided to correspond to the four read/write busses RWBSk (one solid line denotes four wirings in FIG. 1). Each data bus DB is provided commonly to and connected to the driver circuits D0k to D3k and the receiver circuits R0k to R3k. The read control signals RE0 to RE3 exclusively activate the driver circuits D0k to D3k, respectively. The write control signals WE0 to WE3 exclusively activate the receiver circuits R0k to R3k, respectively. As a result, during the read operation, read data output from any one of the driver circuits D0k to D3k is transferred to the receiver circuit RAk via the data buses DB. During the write operation, write data output from the driver circuit DAk is transferred to any one of the receiver circuits R0k to R3k via the data buses DB. FIG. 3 shows a connection relation among the driver circuit DAk, the receiver circuit RAk, the driver circuit D0k, and the receiver circuit R0k corresponding to one data bus DB. As shown in FIG. 3, an input end of the driver circuit D0k and an output end of the receiver circuit R0k are connected to an I/O line MIO. The I/O line MIO is a wiring connected to memory cells selected in the memory bank BANK0.

The driver circuits, the receiver circuits, and the data buses shown in FIG. 1 are elements associated with the data input/output terminal DQk among the circuits and wirings allocated to the memory banks BANK0 to BANK3. Actually, therefore, (n+1) sets of these elements are provided to correspond to the memory banks BANK0 to BANK3 and (n+1) sets of these elements are also provided to correspond to the memory banks BANK4 to BANK7. Therefore, 256 read/write busses RWBS and 256 data buses DB corresponding to the 256 read/write busses RWBS, respectively are provided in the semiconductor device according to the present embodiment. Because the data buses DB, in particular, are long wirings crossing the four memory banks, relatively much power is consumed by charging or discharging of the data buses DB. The present embodiment is intended to reduce power consumption accompanying charging or discharging of such data buses DB.

Each of the memory banks BANK0 to BANK7 includes many memory cells (not shown), and that address signals other than the bank addresses BA0 to BA2 select some of the memory cells. As for selection of the memory cells in the memory banks, because it is not directly relevant to the scope of the present invention, explanations thereof will be omitted.

Figure 4:
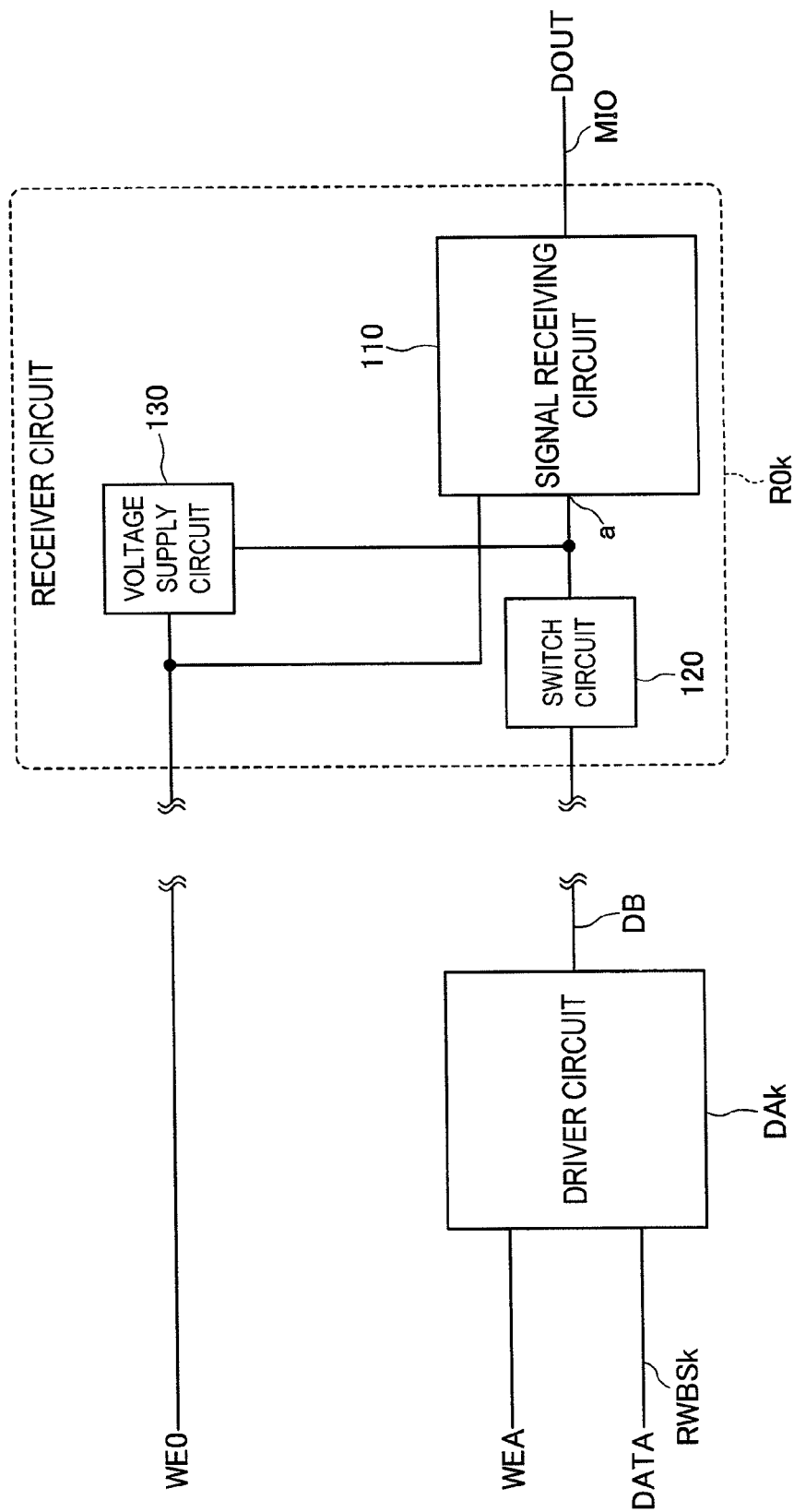
FIG. 4 is a block diagram showing a circuit part X shown in FIG. 3 in more detail.

FIG. 4 is a block diagram showing a circuit part X shown in FIG. 3 in more detail.

As shown in FIG. 4, the receiver circuit R0k includes a signal receiving circuit 110, a switch circuit 120 inserted between the data bus DB that serves as the signal transfer line and an input end 'a' of the signal receiving circuit 110, and a voltage supply circuit 130 connected to the input end 'a' of the signal receiving circuit 110.

The signal receiving circuit 110 is a principal circuit part of the receiver circuit R0k and is a circuit that drives the I/O line MIO based on a potential of the input end 'a'. The switch circuit 120 is a circuit that turns into a conductive state when a potential of the data bus DB is equal to or lower than a predetermined potential, and that turns into a cutoff state when the potential of the data bus DB exceeds the predetermined potential. Further, the voltage supply circuit 130 is a circuit that drives the input end 'a' of the signal receiving circuit 110 to a high level in response to activation of the write control signal WE0.

As shown in FIG. 3, the data bus DB is a bidirectional bus. Accordingly, the driver circuit D0k and the receiver circuit RAk are identical to the driver circuit DAk and the receiver circuit R0k shown in FIG. 4 in its configuration, respectively.

Figure 5:
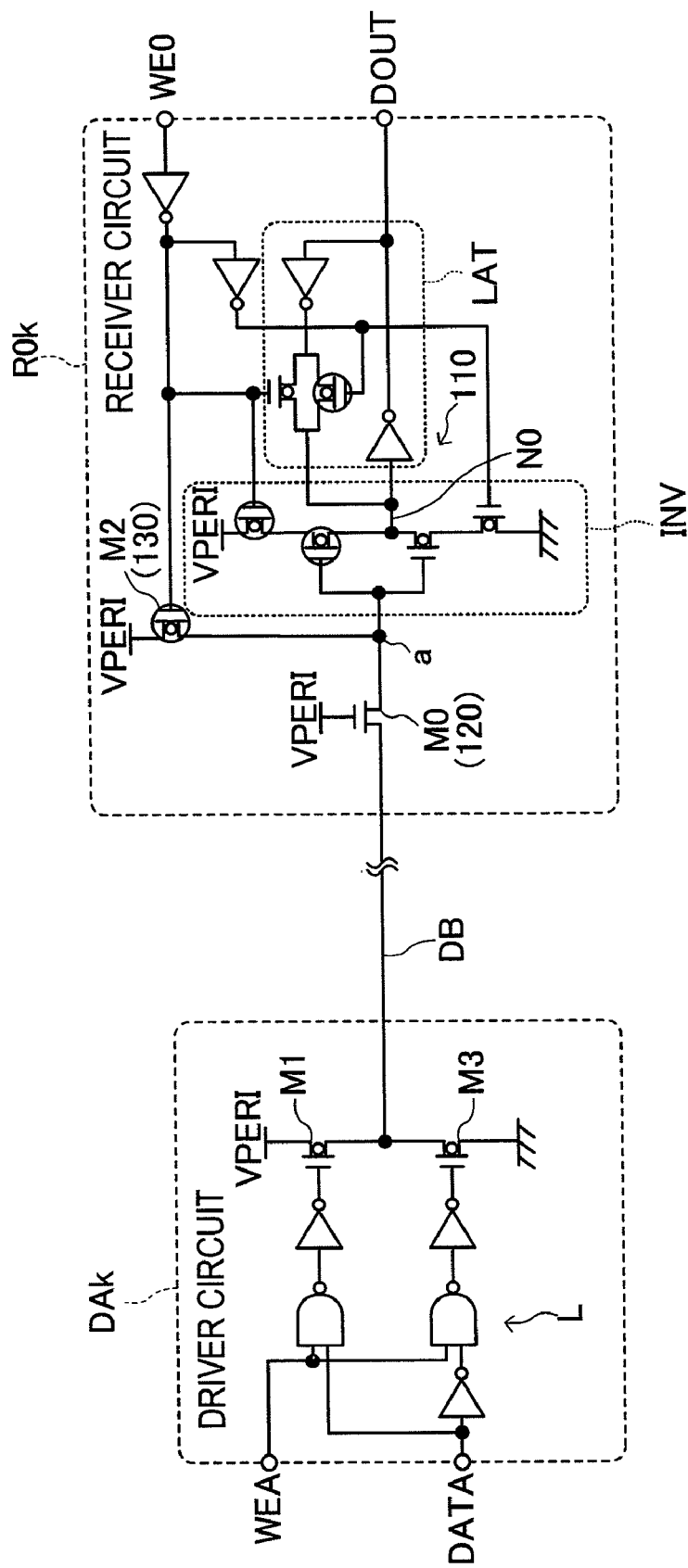
FIG. 5 is a circuit diagram of circuit blocks shown in FIG. 4.

FIG. 5 is a circuit diagram of circuit blocks shown in FIG. 4.

As shown in FIG. 5, the driver circuit DAk includes N-channel MOS transistors M1 and M3 connected in series between power supply wirings which are supplied with a power supply potential VPERI and a ground potential VSS, respectively, and a logical circuit L that generates signals to be applied to gate electrodes of these transistors M1 and M3, respectively. A connection point where the transistors M1 and M3 are connected is connected to the data bus DB. VPERI and VSS are used as operating power supplies for the logical circuit L. Accordingly, input signals supplied to the gate electrodes of the transistors M1 and M2 have amplitude ranging from VPERI to VSS. Alternatively, MIS transistors can be used as the transistors M1 and M2. The same is true for all other MOS transistors to be described later.

With this configuration, assuming that a threshold voltage of the transistors M1 and M2 is LVth, the data bus DB is driven to have a potential VPERI-LVth when the transistor M1 is turned on and driven to have the potential VSS when the transistor M3 is turned on. The threshold voltage LVth is set relatively low. In FIG. 5, small circular marks attached to the respective transistors M1 and M3 mean that the threshold voltage is designed to be relatively low for the transistors M1 and M3. The same is true for other transistors to be described later. In the specification of the present specification, the ground potential VSS, the power supply potential VPERI, and the potential VPERI-LVth are occasionally referred to as "first potential", "second potential", and "fourth potential", respectively. In addition, the transistors M3 and M1 are occasionally referred to as "first output transistor" and "second output transistor", respectively.

The logical circuit L included in the driver circuit DAk receives the write control signal WEA as well as write data DATA supplied from the read/write bus RWBSk, and generates the signals to be applied to the gate electrodes of the transistors M1 and M3 based on logical levels of the WEA and DATA. Specifically, the logical circuit L turns on the transistor M1 or M3 based on the logical level of the write data DATA when the write control signal WEA is activated to a high level, and turns off both of the transistors M1 and M3 when the write control signal WEA is deactivated to a low level.

Meanwhile, the switch circuit 120 included in the receiver circuit R0k is constituted by an N-channel MOS transistor M0 having one end thereof connected to the data bus DB and the other end thereof connected to the input end 'a' of the signal receiving circuit 110. The power supply potential VPERI is supplied to a gate electrode of the transistor M0. With this configuration, assuming that a threshold voltage of the transistor M0 is NVth, the transistor M0 turns into a conductive state when the potential of the data bus DB is equal to or lower than a potential VPERI-NVth and turns from the conductive state to a cutoff state when the potential of the data bus DB exceeds the potential VPERI-NVth. The threshold voltage NVth is designed to be relatively high. That is, the threshold voltages NVth and LVth satisfy a relation of NVth>LVth. In the present specification, the potential VPERI-NVth is occasionally referred to as "third potential". In addition, the transistor M0 is occasionally referred to as "switch transistor".

The transistor M0 is arranged to be as close to the input end 'a' of the signal receiving circuit 110 as possible. By doing so, when the transistor M0 is off-state, a great difference is generated between a load capacity (C1) of the data bus DB and a load capacity (C2) of the input end 'a' (C1>>C2).

The signal receiving circuit 110 included in the receiver circuit R0k includes a clocked inverter INV and a latch circuit LAT that operate based on the write control signal WE0. The clocked inverter INV is an inverter activated when the write control signal WE0 is at a high level. An output end NO of the clocked inverter INV is set to a high level (VPERI) when the potential of the input end 'a' is equal to or lower than a threshold. The output end NO is set to a low level (VSS) when the potential of the input end 'a' exceeds the threshold. An output from the clocked inverter INV is supplied to the latch circuit LAT and fetched by the latch circuit LAT synchronously with a falling edge of the write control signal WE0. Write data DOUT fetched by the latch circuit LAT is supplied to the memory bank BANK0 via the I/O line MIO.

The voltage supply circuit 130 included in the receiver circuit R0k is constituted by a P-channel MOS transistor M2 connected between a power supply wiring to which the power supply potential VPERI is supplied and the input end 'a' of the signal receiving circuit 110. The inverted write control signal WE0 is supplied to a gate electrode of the transistor M2. With this configuration, the transistor M2 is turned on in response to activation of the write control signal WE0 to drive the input end 'a' of the signal receiving circuit 110 to have the power supply potential VPERI. A threshold voltage of the transistor M2 is designed to be LVth similarly to the transistors M1 and M3. In the present specification, the transistor M2 is occasionally referred to as "assist transistor".

The transistor M2 is forcibly turned into a conductive state to drive the input end 'a' to have the power supply potential VPERI in response to the activation of the write control signal WE0 irrespectively of the logical level of the write data DATA transferred via the data bus DB. With this configuration, it is necessary to design a current supply capability of the transistor M2 to be sufficiently low and to be lower than at least that of the transistor M3. Preferably, the current supply capability of the transistor M2 is designed so as not to significantly influence a potential change of the input end 'a' when the transistor M0 is on-state, and so as to promptly boost the potential of the input end 'a' up to the power supply potential VPERI when the transistor M0 is off-state. As described above, when the transistor M0 is off-state, the load capacity (C2) of the input end 'a' is remarkably smaller than the load capacity (C1) of the data bus DB, and therefore it suffices that the current supply capability of the transistor M2 is a capability to drive this load capacity (C2).

With the above configuration, the driver circuit DAk reduces the amplitude (VPERI-VSS) of the write data DATA and the reduced-amplitude write data DATA is transferred to the receiver circuit R0k via the data bus DB. In the receiver circuit R0k, the signal receiving circuit 110 regenerates the amplitude of the write data DATA to (VPERI-VSS) and outputs the amplitude-regenerated write data DATA as write data DOUT.

Figure 6:
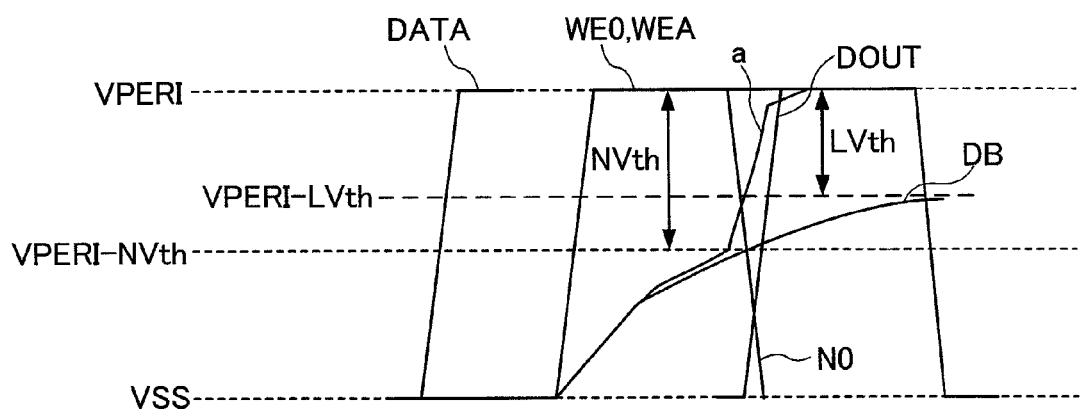
FIG. 6 is a waveform diagram showing an operation when the write data DATA changes from the low level (VSS) to the high level (VPERI)

FIG. 6 is a waveform diagram showing an operation when the write data DATA changes from the low level (VSS) to the high level (VPERI).

As shown in FIG. 6, when the write control signals WEA and WE0 are activated after the write data DATA changes from the low level (VSS) to the high level (VPERI), the transistor M1 is turned on. Accordingly, the potential of the data bus DB starts to rise from VSS. However, a potential rising rate of the data bus DB is gradual to some extent, because the data bus DB is a long wiring and has a large parasitic capacity. In this case, because the threshold voltage of the transistor M0 constituting the switch circuit 120 is NVth, the transistor M0 is kept to be on-state until the potential of the data bus DB exceeds VPERI−NVth. Therefore, the potential of the input end 'a' rises according to an increase in the potential of the data bus DB.

When the potential of the data bus DB exceeds VPERI−NVth, the transistor M0 is turned off. The input end 'a' is thereby disconnected from the data bus DB and is not driven by the transistor M1 any longer. However, at this moment, because the transistor M2 constituting the voltage supply circuit 130 is already on-state, the transistor M2 raises the potential of the input end 'a'. At this time, the load capacity (C2) to be driven by the transistor M2 is very small because the transistor M0 is off-state (and, therefore the load capacity C1 of the data bus DB is not included in the load capacity to be driven by the transistor M2). As a result, as shown in FIG. 6, the potential of the input end 'a' rapidly rises to be close to VPERI.

The clocked inverter INV thereby promptly performs an inversion operation to change the write data DOUT to the high level. Thereafter, the level of the data bus DB continues to gradually increase to ensure that the transistor M0 is off-state. The data bus DB is charged to increase the level of the data bus DB eventually up to the potential VPERI−LVth.

In this way, according to the present embodiment, the data bus DB is not charged up to the power supply potential VPERI, thereby making it possible to suppress a charging or discharging current of the data bus DB. Besides, because the switch circuit 120 and the voltage supply circuit 130 enable the clocked inverter INV to promptly perform the inversion operation, a data transfer rate does not decelerate at all.

Figure 7:
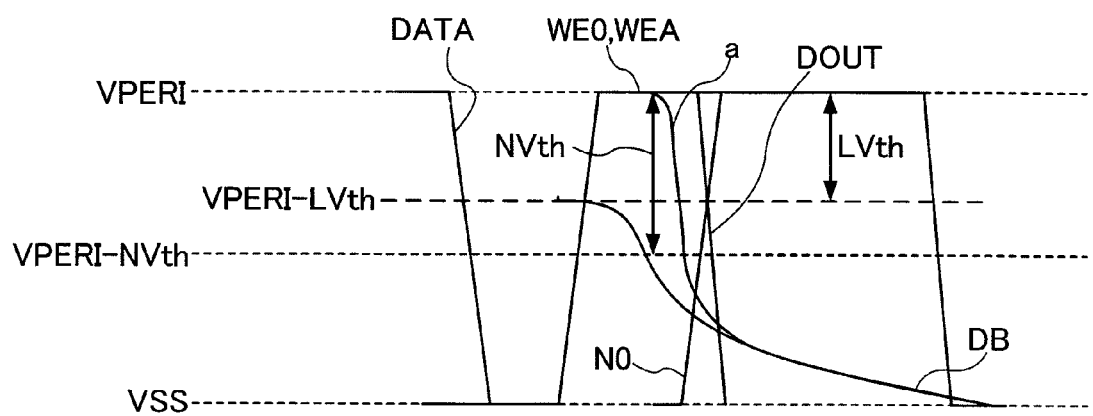
FIG. 7 is a waveform diagram showing an operation when the write data DATA changes from the high level (VPERI) to the low level (VSS)

FIG. 7 is a waveform diagram showing an operation when the write data DATA changes from the high level (VPERI) to the low level (VSS).

As shown in FIG. 7, when the write control signals WEA and WE0 are activated after the level of the write data DATA changes from the high level (VPERI) to the low level (VSS), the transistor M3 is turned on. Accordingly, the potential of the data bus DB starts to fall from the VPERI−LVth. In this case, similarly to the case described with reference to FIG. 6, the potential falling rate is gradual to some extent because of the parasitic capacity of the data bus DB. In this case, because the threshold voltage of the transistor M0 constituting the switch circuit 120 is NVth, the transistor M0 is kept to be off-state until the potential of the data bus DB is equal to or lower than VPERI−NVth. At this time, because the transistor M2 is on-state, the potential of the input end 'a' is kept equal to VPERI.

Thereafter, when the potential of the data bus DB is equal to or lower than VPERI−NVth, the transistor M0 is turned on. The input end 'a' is thereby connected to the data bus DB and the potential of the input end 'a' promptly falls. At this time, the transistor M2 is also on-state. However, as described above, because the current supply capability of the transistor M2 is designed to be sufficiently low, the potential of the input end 'a' is controlled substantially by the transistor M3. Furthermore, a through current flowing through the transistors M2 and M3 is suppressed to be as low as possible.

The clocked inverter INV thereby performs an inversion operation to change the write data DOUT to the low level. Thereafter, the level of the data bus DB continues to gradually decrease to ensure that the transistor M0 is on-state. The data bus DB is discharged to decrease the level of the data bus DB eventually down to the potential VSS.

As described above, according to the present embodiment, the amplitude of the data bus DB is reduced to VPERI−LVth, thereby making it possible to reduce the power consumption accompanying the charging or discharging of the data bus DB. Besides, when the amplitude of the data bus DB exceeds VPERI−NVth, the input end 'a' is disconnected from the data bus DB and the transistor M2 charges the input end 'a'. This can accelerate a transfer change rate from the low level to the high level. On the other hand, when the data bus DB changes from the high level to the low level, a through current is slightly generated. However, an increase in the power consumption according to the generation of the through current can be set sufficiently smaller than a reduction in the power consumption according to the reduced amplitude of the data bus DB. Therefore, the power consumption can be reduced as a whole.

Figure 8:
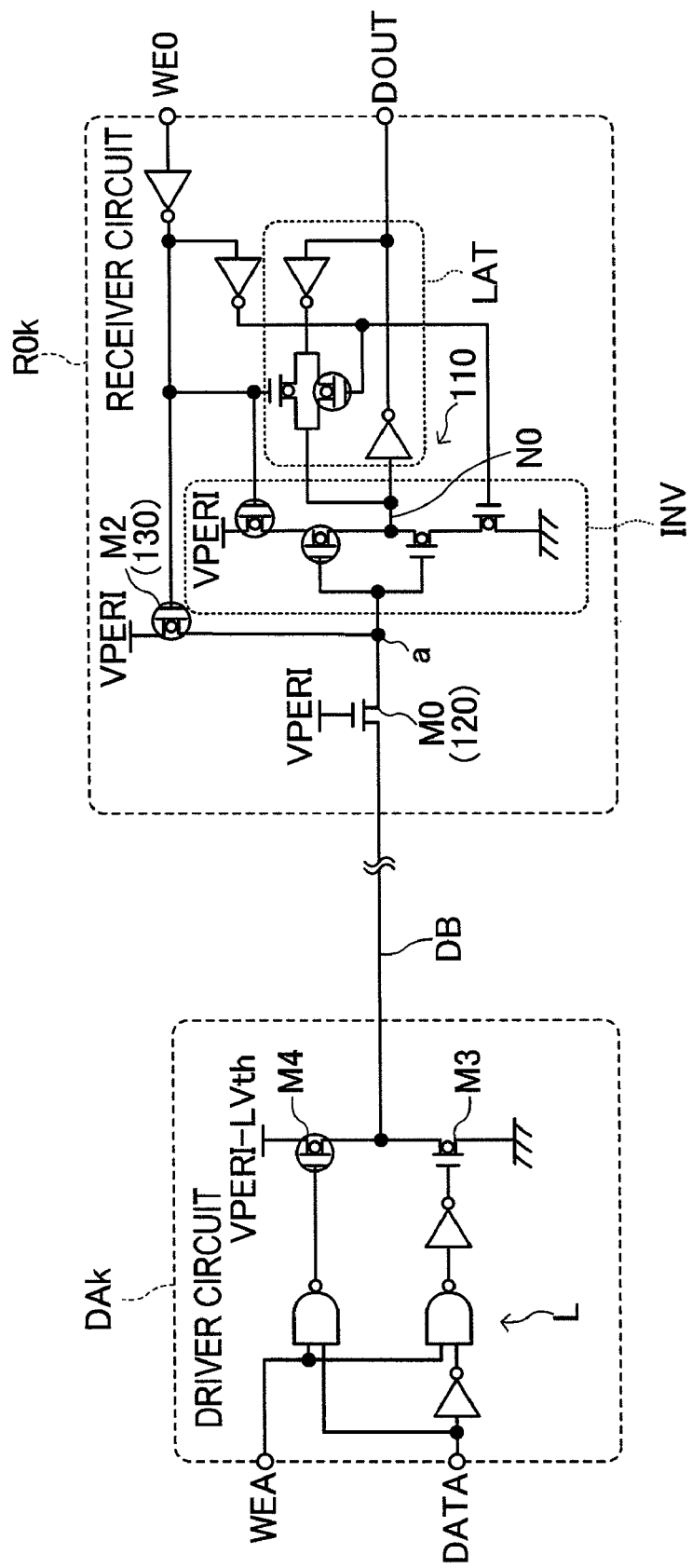
FIG. 8 is a circuit diagram according to a first modification of the embodiment.

FIG. 8 is a circuit diagram according to a first modification of the above embodiment. The circuits shown in FIG. 8 are different from those shown in FIG. 5 in a circuit configuration of a driver circuit DAk. Because other circuit configurations shown in FIG. 8 are identical to those shown in FIG. 5, like elements are denoted by like reference numerals and redundant explanations thereof will be omitted.

In the modification shown in FIG. 8, a P-channel MOS transistor M4 is used in stead of the transistor M1, and a potential VPERI−LVth is supplied to a source of the transistor M4. In this way, the transistor M4 is opposite in conduction type to the transistor M1, and thus an inverted signal with respect to a signal to be supplied to the gate electrode of the transistor M1 is used as a signal supplied to a gate electrode of the transistor M4. With this configuration, the data bus DB is driven to have the potential VPERI−LVth when the transistor M4 is turned on. Therefore, the circuits shown in FIG. 8 can operate similarly to those shown in FIG. 5.

Figure 9:
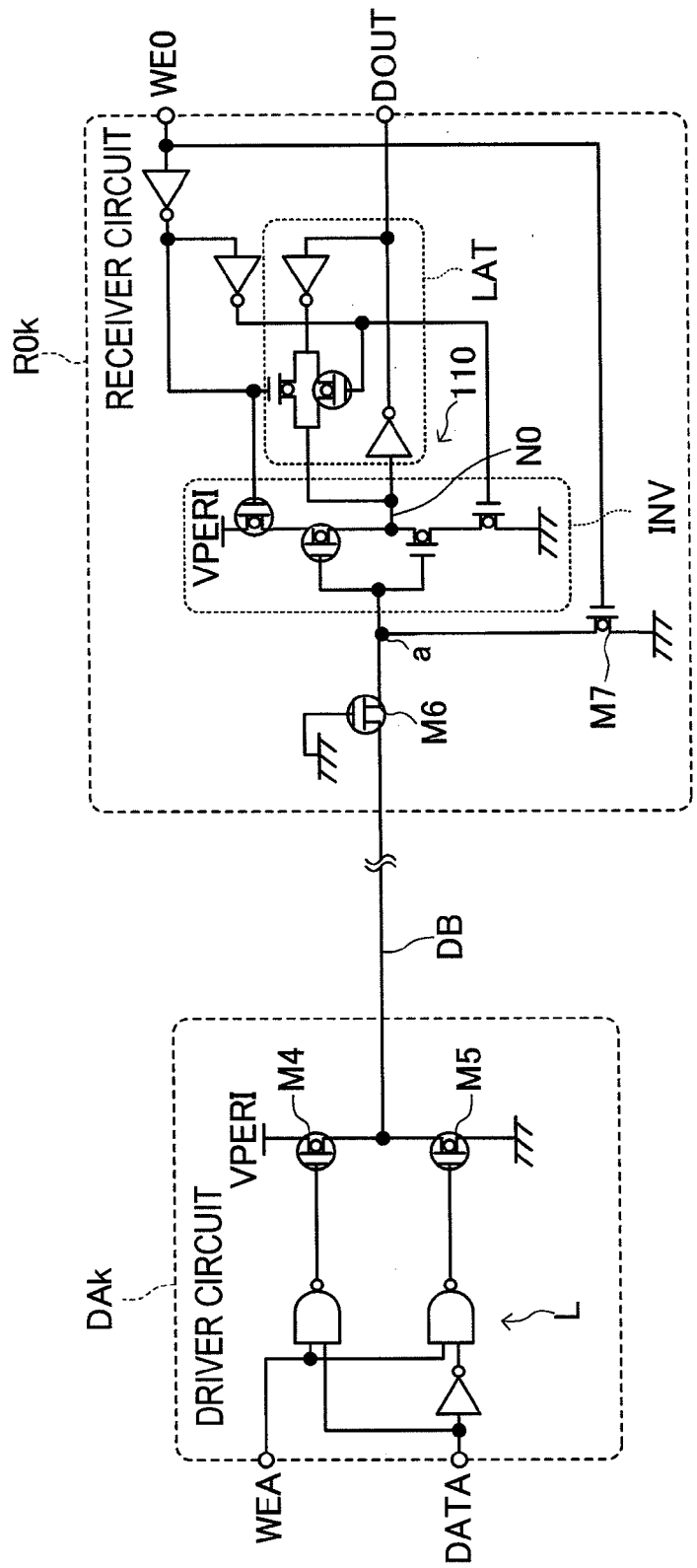
FIG. 9 is a circuit diagram according to a second modification of the embodiment.

FIG. 9 is a circuit diagram according to a second modification of the embodiment of the present invention. The circuits shown in FIG. 9 have an inverted polarity with respect to those shown in FIG. 5. Because other circuit configurations shown in FIG. 9 are identical to those shown in FIG. 5, like elements are denoted by like reference numerals and redundant explanations thereof will be omitted.

In the modification shown in FIG. 9, P-channel MOS transistors M5 and M4 are used in stead of the transistors M1 and M3, respectively. A threshold voltage of the transistor M5 is LVth. Needless to say, signals supplied to gate electrodes of the transistors M5 and M4 are inverted signals with respect to those to be supplied to those of the transistors M3 and M1. Further, a P-channel MOS transistor M6 in stead of the N-channel MOS transistor M0 is used to constitute a switch circuit 120 and an N-channel MOS transistor M7 in stead of the P-channel MOS transistor M2 is used to constitute a voltage supply circuit 130. A threshold voltage of the transistor M6 is NVth.

With this configuration, oppositely from that of the circuits shown in FIG. 5, a potential change rate from a high level to a low level accelerates. Note that an N-channel MOS transistor is higher than a P-channel MOS transistor in a current supply capability per unit area. Therefore, the P-channel MOS transistors occupy a wide space, particularly at a side of the driver circuit DAk that requires to have a high driving capability. Accordingly, from the viewpoint of space occupying, it is more preferable to use the circuits shown in FIG. 5.

Figure 10:
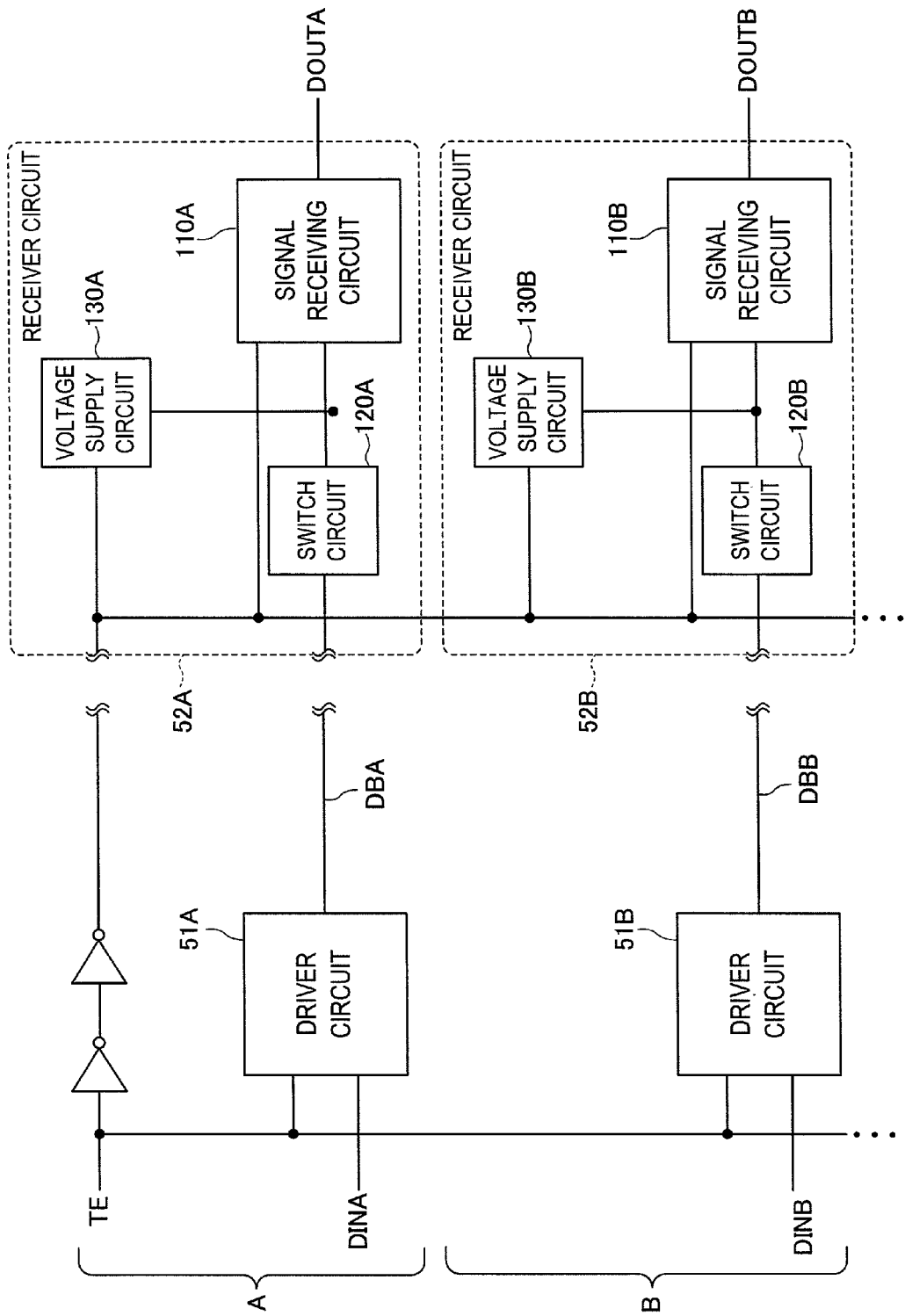
FIG. 10 is a circuit diagram according to a third modification of the embodiment.

While an example of applying a DRAM to the semiconductor device according to the present invention has been described above, the application target of the present invention is not limited thereto. The present invention can be also applied to other semiconductor memories (such as an SRAM, a flash memory, a PRAM, an MRAM, and a RRAM), or applied to semiconductor devices other than memories. That is, the semiconductor device according to the present invention is applicable to a data transmitting/receiving circuit configured to include general "driver circuits" and "receiver circuits". FIG. 10 is a block diagram showing such a data transmitting/receiving circuit according to a third modification of the above embodiment, and showing an example including two signal paths A and B. The transfer path A is a circuit block that supplies input data DINA input to a driver circuit 51A to a receiver circuit 52A via a data bus DBA and that regenerates the data as output data DOUTB. The receiver circuit 52A includes a signal receiving circuit 110A, a switch circuit 120A, and a voltage supply circuit 130A. The transfer path B is identical to the transfer path A in its configuration. A common activation signal TE is supplied to the transfer paths A and B. The activation signal TE is a signal corresponding to a write control signal. It is not always necessary that a plurality of signal paths are present in the data transmitting/receiving circuit according to the present invention, and the present invention is also applicable to a data transmitting/receiving circuit constituted by a single signal path.

Figure 11:
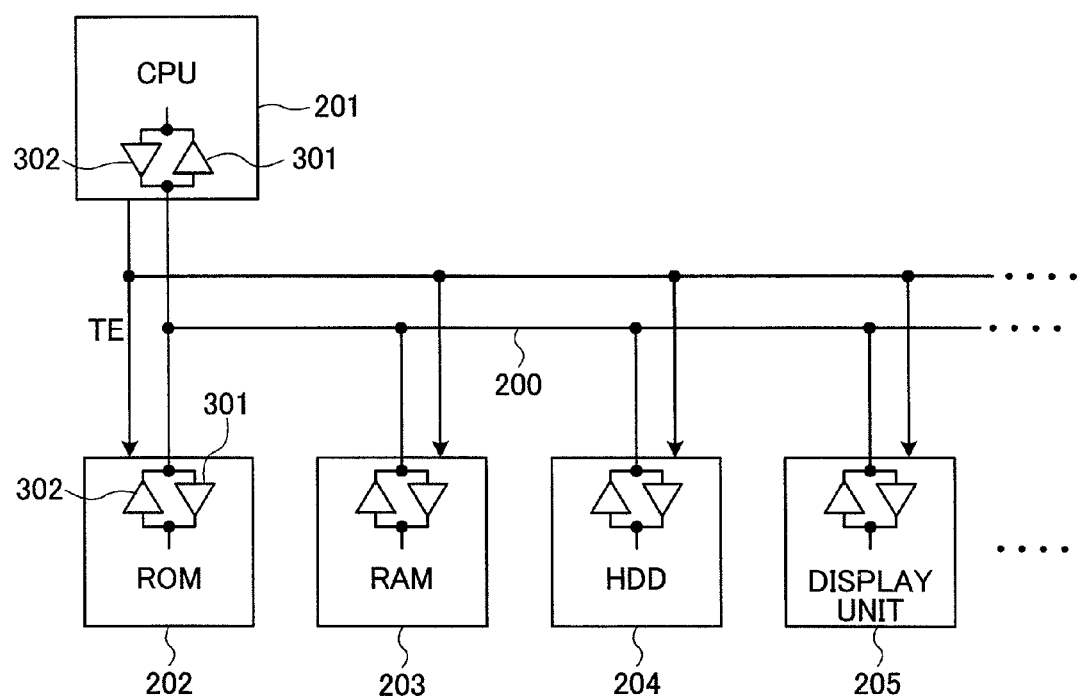
FIG. 11 is a block diagram showing a data transmitting/receiving system.

FIG. 11 is a block diagram showing a data transmitting/receiving system to which the data transmitting/receiving circuit shown in FIG. 10 is applied. The data transmitting/receiving system shown in FIG. 11 is configured such that a CPU 201, a ROM 202, a RAM 203, an HDD 204, a display unit 205 and the like are connected to one another via a bidirectional bus line 200. Each of the devices 201 to 205 includes an input buffer 301 and an output buffer 302 connected to the bus line 200. When the circuits shown in FIG. 5 or the like are used as the input buffer 301 and the output buffer 302 included in each of the devices 201 to 205 in the system configured as shown in FIG. 11, it is possible to reduce a charging or discharging current of the bus line 200. In this case, it suffices that the CPU 201 supplies the activation signal TE corresponding to a write control signal to the respective functional blocks 202 to 205, respectively.

It is apparent that the present invention is not limited to the above embodiments, but may be modified and changed without departing from the scope and spirit of the invention.

For example, in the receiver circuit R0k shown in FIG. 5, when the write control signal WE0 is activated, the transistor M2 is always on-state. However, it is not essential that the transistor M2 is always on-state, and it suffices to turn on the transistor M2 after at least the switch circuit 120 is cut off.

What is claimed is:

1. A semiconductor device comprising:
a signal transfer line that is driven between a first potential and a fourth potential;
a signal receiving circuit having an input node;
a switch circuit connected between the signal transfer line and the input node of the signal receiving circuit; and
a voltage supply circuit connected to the input node of the signal receiving circuit,
wherein the switch circuit turns on when the signal transfer line is between the first potential and third potential and off when the signal transfer line exceeds the third potential, the third potential being between the first potential and the fourth potential, and
the voltage supply circuit supplies a second potential to the input node of the signal receiving circuit at least after the switch circuit turns off, the fourth potential being between the second and third potentials.

2. The semiconductor device as claimed in claim 1, further comprising a driver circuit that drives the signal transfer line between the first potential and the fourth potential.

3. The semiconductor device as claimed in claim 2, wherein the driver circuit includes a first output transistor connected between a first power supply wiring to which the first potential is supplied and the signal transfer line, and the signal transfer line is thereby driven to the first potential when the first output transistor turns on.

4. The semiconductor device as claimed in claim 3, wherein
the driver circuit further includes a second output transistor connected between a second power supply wiring to which the second potential is supplied and the signal transfer line,
the second output transistor having a same conductivity type as the first output transistor, a threshold voltage of the second output transistor being substantially equivalent to a difference between the fourth potential and the second potential, and the signal transfer line is thereby driven to the fourth potential when the second output transistor turns on.

5. The semiconductor device as claimed in claim 3, wherein
the driver circuit further includes a second output transistor connected between a third power supply wiring to which the fourth potential is supplied and the signal transfer line,
the second output transistor having a different conductivity type from the first output transistor, and the signal transfer line is thereby driven to the fourth potential when the second output transistor turns on.

6. The semiconductor device as claimed in claim 4, wherein an input signal supplied to a control electrode of each of the first and second output transistors has amplitude ranging between the first potential and the second potential.

7. The semiconductor device as claimed in claim 3, wherein
the switch circuit includes a switch transistor having one end connected to the signal transfer line and other end connected to the input node of the signal receiving circuit, and
the second potential being supplied to a control electrode of the switch transistor, and a threshold voltage of the switch transistor being substantially equivalent to a difference between the third potential and the second potential.

8. The semiconductor device as claimed in claim 7, wherein the switch transistor and the first output transistor have a same conductivity type as each other.

9. The semiconductor device as claimed in claim 3, wherein
the voltage supply circuit includes an assist transistor connected between a second power supply wiring to which the second potential is supplied and the input node of the signal receiving circuit, and
the assist transistor turns on when the signal receiving circuit is activated.

10. The semiconductor device as claimed in claim 9, wherein the assist transistor and the first output transistor have a different conductivity type from each other.

11. The semiconductor device as claimed in claim 9, wherein a current supply capability of the assist transistor is lower than a current supply capability of the first output transistor.

12. The semiconductor device as claimed in claim 1, wherein the signal receiving circuit uses the first and second potentials as operating power supply potentials.

13. The semiconductor device as claimed in claim 2, further comprising a plurality of memory banks, wherein the signal receiving circuit is provided to each of the memory banks, and the driver circuit transfers write data supplied from outside to a plurality of the signal receiving circuits via the signal transfer line connected in common to the signal receiving circuits.

14. The semiconductor device as claimed in claim 13, wherein the signal receiving circuits are exclusively activated based on an address signal.

15. The semiconductor device as claimed in claim 13, wherein
the driver circuit is provided to each of the plurality of memory banks,
the signal transfer line is provided in common to the driver circuits, and
the signal receiving circuits receives read data supplied from any one of the driver circuits.

16. The semiconductor device as claimed in claim 15, wherein the driver circuits are exclusively activated based on an address signal.

17. An apparatus comprising:
a first unit,
a second unit; and
a signal transfer line coupled between the first and second units,
wherein one of the first and second units comprises:
a first driver driving the signal transfer line between a first potential and a fourth potential; and
the other of the first and second units comprises:
a first signal receiving circuit having an input node;
a first switch circuit connected between the signal transfer line and the input node of the first signal receiving circuit, the first switch circuit being turned ON when the signal transfer line is between the first potential and a third potential and OFF when the signal transfer line exceeds the third potential, the third potential being between the first potential and the fourth potential; and
a first voltage supply circuit connected to the input node of the first signal receiving circuit, the first voltage supply circuit supplying a second potential to the input node of the first signal receiving circuit at least after the first switch circuit is turned OFF, the fourth potential being between the second and third potentials.

18. The apparatus as claimed in claim 17, wherein the other of the first and second units further comprises:
a second driver driving the signal transfer line between the first potential and the fourth potential; and
the one of the first and second units further comprises;
a second signal receiving circuit having an input node;
a second switch circuit connected between the signal transfer line and the input node of the second signal receiving circuit, the second switch circuit being turned ON when the signal transfer line is between the first potential and the third potential and OFF when the signal transfer line exceeds the third potential; and
a second voltage supply circuit connected to the input node of the second signal receiving circuit, the second voltage supply circuit supplying the second potential to the input node of the second signal receiving circuit at least after the second switch circuit is turned OFF.

19. The apparatus as claimed in claim 17, wherein the first driver is activated in response to a first control signal to be allowed to drive the signal transfer line, and the first voltage supply circuit is activated in response to a second control signal to be allowed to supply the second potential to the input node of the first signal receiving circuit, the second control signal being generated independently of an output of the first signal receiving circuit.

20. The apparatus as claimed in claim 19, wherein the first and second control signals are different from each other.

21. The device as claimed in claim 19, wherein the first and second control signals are equal to each other.

22. An apparatus comprising:
a signal transfer line supplied with a data signal; and
a receiver circuit that comprises:
an input node coupled to the signal transfer line;
a circuit node;
a first voltage node supplied with a first power voltage;
a first transistor including a source-drain path coupled between the input node and the circuit node and a gate coupled to the first voltage node; and
a second transistor including a source-drain path coupled between the first voltage node and the circuit node and a gate supplied with a first control signal, the first control signal changing between a first logic level that turns the second transistor ON and a second logic level that turns the second transistor OFF, the first control signal being independent in logic level of the circuit node.

23. The apparatus as claimed in claim 22, wherein the data signal changes between first and second potential levels, and the first transistor is turned ON when the data signal is between the first potential level and a third potential level and OFF when the data signal exceeds the third potential level, the third potential being between the first and second potentials, and the second potential being between the third potential and the first power voltage.

24. The apparatus as claimed in claim 22, wherein the first control signal is changed from the second logic level to the first logic level when the receiver circuit is activated, and the first control signal is maintained at the first logic level irrespective of a change in logic level of the circuit node.

25. The apparatus as claimed in claim 22, further comprising a driver circuit that is activated in response to an active level of a second control signal to supply the data signal to the signal transfer line and deactivated in response to an inactive level of the second control signal to stop supplying the data signal to the signal transfer line, the first and second control signals being different from each other.

26. The apparatus as claimed in claim 22, further comprising a driver circuit that is activated in response to an active level of a second control signal to supply the data signal to the signal transfer line and deactivated in response to an inactive level of the second control signal to stop supplying the data signal to the signal transfer line, the first control signal being used as the second control signal.

27. The apparatus as claimed in claim 23, further comprising a driver circuit that drives the signal transfer line to supply the data signal thereto, the driver circuit including a third transistor coupled between the first voltage node and the signal transfer line and a fourth transistor coupled between the signal transfer line and a second voltage node supplied with the first potential, each of the first, third and fourth, transistors being of a first channel type, the second transistor being of a second channel type, the first power voltage being greater than each of the first, second and third potentials.

28. The apparatus as claimed in claim 23, further comprising a driver circuit that drives the signal transfer line to supply the data signal thereto, the driver circuit including a third transistor coupled between a second voltage node supplied with the second potential and the signal transfer line and a fourth transistor coupled between the signal transfer line and a third voltage node supplied with the first potential, each of the first and fourth transistors being of a first channel type, each of the second and third transistors being of a second channel type, the first power voltage being greater than each of the first, second and third potentials.

29. The apparatus as claimed in claim 23, further comprising a driver circuit that drives the signal transfer line to supply the data signal thereto, the driver circuit including a third transistor coupled between a second voltage node supplied with the first potential and the signal transfer line and a fourth transistor coupled between the signal transfer line and the first voltage node, each of the first, third and fourth transistors being of a first channel type, the second transistor being of a second channel type, the first power voltage being smaller than each of the first, second and third potentials.

30. The apparatus as claimed in claim 22, wherein, the receiver circuit further comprises an inverter circuit that includes an input end coupled to the circuit node, an output end, a third transistor coupled between the first voltage node and the output end and a fourth transistor coupled between the output end and a second voltage node supplied with a second power voltage, each of third and fourth transistors including a gate coupled to the input end.

31. The apparatus as claimed in claim 30, wherein the inverter circuit further includes a fifth transistor coupled between the first voltage node and the output end in series with the third transistor and a sixth transistor coupled between the output end and the second voltage node in series with the fourth transistor, the fifth transistor receiving the first control signal at a gate thereof, and the sixth transistor receiving an inverted signal of the first control signal at a gate thereof.

* * * * *